(12) United States Patent
Koda et al.

(10) Patent No.: US 7,791,085 B2
(45) Date of Patent: Sep. 7, 2010

(54) SEMICONDUCTOR LIGHT EMITTING APPARATUS

(75) Inventors: Rintaro Koda, Tokyo (JP); Takahiro Arakida, Kanagawa (JP); Yoshinori Yamauchi, Tokyo (JP); Norihiko Yamaguchi, Kanagawa (JP); Yuji Masui, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/604,514

(22) Filed: Nov. 27, 2006

(65) Prior Publication Data

US 2007/0120133 A1      May 31, 2007

(30) Foreign Application Priority Data

Nov. 30, 2005   (JP) ............................. 2005-345966

(51) Int. Cl.
    *H01L 29/161* (2006.01)
(52) U.S. Cl. .............................. 257/84; 257/80; 257/82; 257/184; 257/431; 257/E33.076; 257/E31.091; 257/E21.528; 257/E33.077; 372/45.01; 372/50.1; 372/50.21
(58) Field of Classification Search .................... 257/84; 372/20
    See application file for complete search history.

(56) References Cited

U.S. PATENT DOCUMENTS

| | | | | |
|---|---|---|---|---|
| 4,766,471 | A | * | 8/1988 | Ovshinsky et al. ............. 257/53 |
| 5,285,078 | A | * | 2/1994 | Mimura et al. ................. 257/3 |
| 5,493,577 | A | * | 2/1996 | Choquette et al. ...... 372/46.013 |
| 5,828,085 | A | * | 10/1998 | Kashima et al. ............... 257/80 |
| 6,483,862 | B1 | * | 11/2002 | Aronson et al. ........... 372/50.21 |
| 6,627,923 | B1 | * | 9/2003 | Lipson et al. ................ 257/102 |
| 6,643,304 | B1 | * | 11/2003 | Chen et al. ................ 372/50.11 |
| 7,075,954 | B2 | * | 7/2006 | Ledentsov et al. ............. 372/20 |
| 2002/0088980 | A1 | * | 7/2002 | Wipiejewski ................. 257/79 |
| 2002/0139984 | A1 | * | 10/2002 | Sugawara et al. .............. 257/79 |
| 2002/0186726 | A1 | * | 12/2002 | Ledentsov et al. ............. 372/20 |
| 2003/0235226 | A1 | * | 12/2003 | Ueki ............................ 372/46 |
| 2004/0031965 | A1 | * | 2/2004 | Forrest et al. ................. 257/79 |
| 2005/0056772 | A1 | * | 3/2005 | Kaneko .................... 250/214.1 |

FOREIGN PATENT DOCUMENTS

| | | | |
|---|---|---|---|
| JP | 10-135568 | * | 5/1998 |
| JP | 11-121878 | | 4/1999 |
| JP | 2002-504754 | | 2/2002 |

* cited by examiner

*Primary Examiner*—Minh-Loan T Tran
*Assistant Examiner*—Fei Fei Yeung Lopez
(74) *Attorney, Agent, or Firm*—Robert J. Depke; Rockey, Depke & Lyons, LLC

(57) ABSTRACT

Disclosed herein is a semiconductor light emitting apparatus that includes: a semiconductor light emitting device having a first semiconductor laminate structure including a light emitting region, and a light outgoing window permitting the light emitted from the light emitting region to go out therethrough in the lamination direction; a light transmitting part provided in a region corresponding to the light emitting region; a metal part provided in a region, corresponding to an outer peripheral region of the light emitting region, of the first semiconductor laminate structure; and a semiconductor light detector having a second semiconductor laminate structure including a light absorbing layer for absorbing a part of the light incident from the lamination direction. In the apparatus, the semiconductor light emitting device, a layer including the light transmitting part and the metal part, and the semiconductor light detector are integrally formed in the state of being laminated in this order.

20 Claims, 8 Drawing Sheets

SEMICONDUCTOR LIGHT EMITTING APPARATUS

CROSS REFERENCES TO RELATED APPLICATIONS

The present invention contains subject matter related to Japanese Patent Application JP 2005-345966 filed in the Japanese Patent Office on Nov. 30, 2005, the entire contents of which is incorporated herein by reference.

BACKGROUND OF THE INVENTION

1. Field of the Invention

The present invention relates to a semiconductor light emitting apparatus having a light detecting device for detecting emitted light, particularly to a semiconductor light emitting apparatus favorably applicable to uses where a high degree of light detection accuracy is demanded.

2. Description of the Related Art

Hitherto, a semiconductor light emitting apparatus for such uses as optical fiber and optical disk has been provided with a light detecting mechanism for detecting the light emitted from a semiconductor light emitting device incorporated therein, as means for making constant the light output level of the semiconductor light emitting device. The light detecting mechanism can be composed, for example, of a reflector for branching a part of the emitted light, and a semiconductor light detector for detecting the emitted light thus branched. In such a configuration, however, the number of component parts would be large, and it would be necessary to lay out the reflector and the semiconductor light detector at a high accuracy in relation to the semiconductor light emitting device. As a measure to solve such a problem, a configuration may be contemplated in which the semiconductor light emitting device and the semiconductor light detector are formed integrally.

However, where the semiconductor light emitting device and the semiconductor light detector are formed integrally, the semiconductor light detector may detect not only the stimulatedly emitted light to be intrinsically detected but also spontaneously emitted light. In such a case, therefore, the light output level of the semiconductor light emitting device which is measured on the basis of the light detected by the semiconductor light detector includes an error corresponding to the spontaneously emitted light. Accordingly, the semiconductor light emitting apparatus with such a configuration is not suited to uses where high-accuracy control of light output level is demanded.

In view of the foregoing, Japanese Patent No. 2877785 (hereinafter referred to as Patent Document 1) proposes a technology in which a control layer is provided in a semiconductor light detector so that a part of spontaneously emitted light inputted from a semiconductor light emitting device is shielded before being detected by the semiconductor light detector.

SUMMARY OF THE INVENTION

Meanwhile, the control layer is formed by oxidizing a part of a semiconductor material constituting the semiconductor light detector. However, the semiconductor material thus oxidized is not so high in reflectance, and it would transmit the spontaneously emitted light to some extent, making it difficult to sufficiently reduce the level of detection of the spontaneously emitted light by the semiconductor light detector. Therefore, the proposed technology has the problem that it may be impossible to satisfactorily enhance the light detection accuracy.

Thus, there is a need to provide a semiconductor light emitting apparatus in which spontaneously emitted light is reflected at a high reflectance so as to reduce the level of detection of the spontaneously emitted light by a semiconductor light detector, whereby light detection accuracy can be enhanced more than in the above-mentioned related art.

According to an embodiment of the present invention, there is provided a semiconductor light emitting apparatus in which a semiconductor light emitting device, a layer included a light transmitting part and a metal part, and a semiconductor light detector are integrally formed in the state of being laminated in this order. The semiconductor light emitting device has a first semiconductor laminate structure including a light emitting region, and a light outgoing window permitting the light emitted from the light emitting region to go out therethrough in the lamination direction. The semiconductor light detector has a second semiconductor laminate structure including a light absorbing layer for absorbing a part of the light incident from the lamination direction. The light transmitting part is provided in a region corresponding to the light transmitting part, and the metal part is provided in a region, corresponding to an outer peripheral region of the light emitting region, of the first semiconductor laminate structure.

Here, when the semiconductor light detector includes an opening part, the light outgoing window of the semiconductor light emitting device may be laid out on the opening part side; on the other hand, when the semiconductor light emitting device includes an opening part, the light outgoing window of the semiconductor light emitting device may be laid out on the side opposite to the opening part.

In the semiconductor light emitting apparatus according to an embodiment of the present invention, the light emitted from the light emitting region includes not only inducedly emitted light but also spontaneously emitted light. However, induced emission is repeated in the first semiconductor laminate structure by the emitted light, with the result that oscillation at a predetermined wavelength is generated, and light with the predetermined wavelength is let go out through the light outgoing window. In this case, since the layer included the light transmitting part and the metal part is provided between the semiconductor light emitting device and the semiconductor light detector, the light having been transmitted through the light transmitting part is incident on the light absorbing layer of the semiconductor light detector. A part of the light incident on the light absorbing layer is absorbed into the light absorbing layer, and an electrical signal according to the quantity of the light thus absorbed is produced. This makes it possible to measure the output level of the light outgoing from the light outgoing window by utilizing this electrical signal.

Here, since the light transmitting part is provided in the region corresponding to the light emitting region and the metal part is provided in the region, corresponding to the outer peripheral region of the light emitting region, of the first semiconductor laminate structure, most of the induced emitted light, emitted to the semiconductor light detector side, of the light emitted from the light emitting region is transmitted through the light transmitting part, to be incident on the semiconductor light detector. On the other hand, most of the spontaneously emitted light, emitted to the semiconductor light detector side, of the emitted light is reflected by the metal part toward the semiconductor light emitting device side, to be thereby inhibited from entering into the semiconductor light detector. This is because the induced emitted light has such a directivity as to be rarely emitted to the metal part side, whereas the spontaneously emitted light has no directivity and is mostly emitted to the metal part side. This ensures that the quantity of the spontaneously emitted light which is transmitted through the light transmitting part can be made to be extremely small, as compared with the quantity of the induced emitted light which is transmitted through the light transmitting part. In addition, since the metal part is generally extremely high in reflectance, the quantity of the spontaneously emitted light which is transmitted through the metal part is almost negligible, as compared with the quantity of the spontaneously emitted light which is transmitted through the light transmitting part.

Here, in the case where the semiconductor light detector is arranged on the light outgoing window side of the semiconductor light emitting device, a part of the light emitted from the light outgoing window side is absorbed into the light absorbing layer; on the other hand, in the case where the semiconductor light detector is arranged on the side, opposite to the light outgoing window, of the semiconductor light emitting device, a part of the light, emitted to the opposite side of the light outgoing window, of the emitted light generated in the light emitting region is absorbed into the light absorbing layer.

According to the semiconductor light emitting apparatus in an embodiment of the present invention, the layer included the light transmitting part and the metal part is provided between the semiconductor light emitting device and the semiconductor light detector, so that the spontaneously emitted light which is emitted to the metal part side can be almost inhibited from being incident on the semiconductor light detector. As a result, the level of detection of the spontaneously emitted light by the semiconductor light detector can be lowered, so that light detection accuracy can be enhanced more than in the related art.

DETAILED DESCRIPTION OF THE PREFERRED EMBODIMENTS

Figure 1:
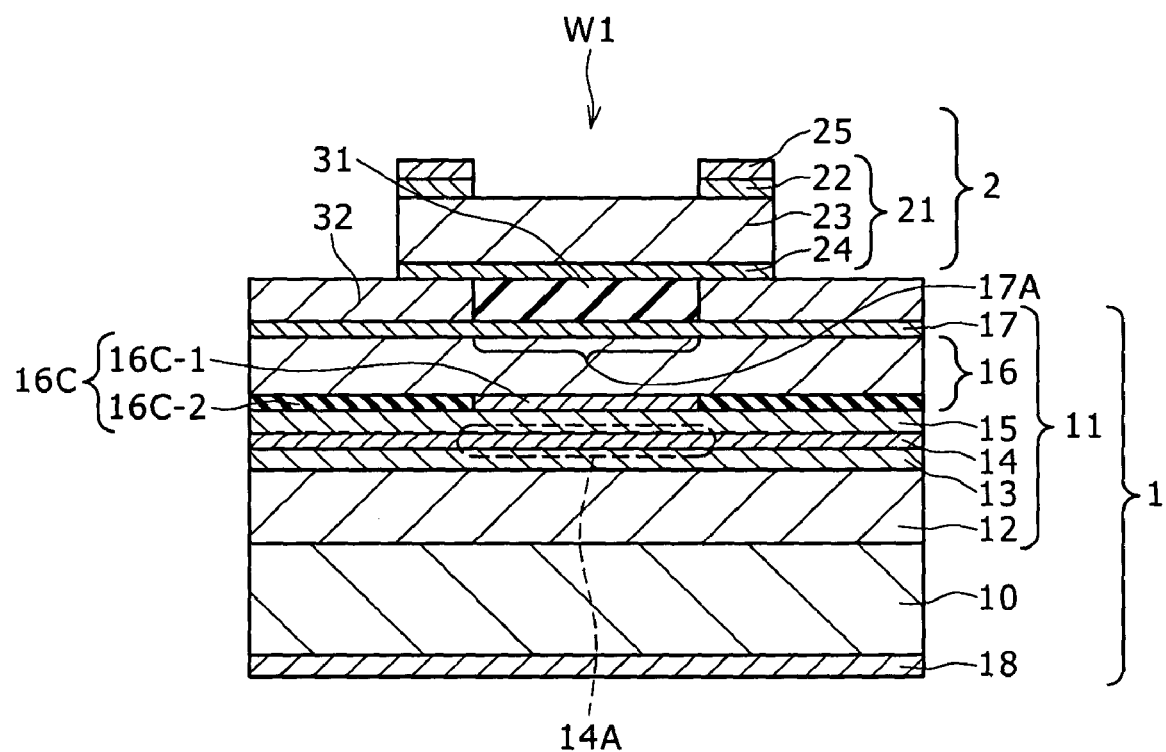
FIG. 1 is a sectional diagram showing the configuration of a semiconductor light emitting apparatus according to a first embodiment of the present invention.

Now, some embodiments of the present invention will be described in detail below, referring to the drawings.

First Embodiment

FIG. 1 illustrates the sectional configuration of a semiconductor light emitting apparatus according to a first embodiment of the present invention. The semiconductor light emitting apparatus has a configuration in which a layer composed of a light transmitting part 31 and a metal part 32 and a semiconductor light detector 2 are sequentially arranged in this order on a plane light emission type semiconductor laser 1, and the plane light emission type semiconductor laser 1, the semiconductor light detector 2, and the layer composed of the light transmitting part 31 and the metal part 32 are integrally formed. In the semiconductor light emitting apparatus, light emitted from the plane light emission type semiconductor laser 1 is transmitted through a light outgoing window 17A (described later), the light transmitting part 31 and the semiconductor light detector 2 to go out through an opening part W1 (described later) to the exterior, and an electrical signal according to the output level of the light going out through the light outgoing window 17A is outputted from the semiconductor light detector 2. In other words, the semiconductor light emitting apparatus has a configuration in which the layer composed of the light emitting part 31 and the metal layer 32 and the semiconductor light detector 2 are arranged in this order on the side on which the light emitted from the plane light emission type semiconductor laser 1 goes out to the exterior. Incidentally, FIG. 1 shows the configuration schematically, and the dimensions and shapes in the figure are different from the actual ones.

<Plane Light Emission Type Semiconductor Laser 1>

The plane light emission type semiconductor laser 1 has a semiconductor laminate structure 11 on one side of a substrate 10. The semiconductor laminate structure 11 has a configuration in which an n-type DBR layer 12, an n-type clad layer 13, an active layer 14, a p-type clad layer 15, a p-type DBR layer 16, and a p-type contact layer 17 are laminated in this order on the substrate 10. Incidentally, the semiconductor laminate structure 11 corresponds to the "first semiconductor laminate structure" in the present invention, the n-type DBR layer 12 and the n-type clad layer 13 correspond to the "first semiconductor layer of a first conduction type" in the present invention, and the p-type clad layer 15, the p-type DBR layer 16 and the p-type contact layer 17 correspond to the "second semiconductor layer of a second conduction type" in the present invention.

The substrate 10 and the semiconductor laminate structure 11 are each composed, for example, of a GaAs (gallium arsenic) based compound semiconductor. Incidentally, the GaAs based compound semiconductor refers to a compound semiconductor which contains at least gallium (Ga) of the Group 3B elements in the short period type periodic table, and at least arsenic (As) of the Group 5B elements in the short period type periodic table.

The substrate 10, is composed, for example, of n-type GaAs. The n-type DBR layer 12 is configured by laminating a plurality of sets of a low refractive index layer (not shown)

and a high refractive index layer (not shown). The low refractive index layer is formed, for example, of n-type $Al_{x1}Ga_{1-x1}As$ ($0<x1<1$) having a thickness of $\lambda/4n_1$ (where $\lambda$ is the oscillation wavelength, and $n_1$ is the refractive index), and the high refractive index layer is formed, for example, of n-type $Al_{x2}Ga_{1-x2}As$ ($0<x2<x1$) having a thickness of $\lambda/4n_2$ (where $n_2$ is the refractive index). Incidentally, examples of the n-type impurity include silicon (Si) and selenium (Se).

The n-type clad layer 13 is composed, for example, of $Al_{x3}Ga_{1-x3}As$ ($0<x3<1$). The active layer 14 is composed, for example, of $Al_{x4}Ga_{1-x4}As$ ($0<x4<1$), and has a light emitting region 14A in a region opposed to an electron injecting region 16C-1 which will be described later. The p-type clad layer 15 is composed, for example, of $Al_{x5}Ga_{1-x5}As$ ($0<x5<1$). The n-type clad layer 13, the active layer 14 and the p-type clad layer 15 are desirably free of impurities, but a p-type or n-type impurity or impurities may be contained therein. Incidentally, examples of the p-type impurity include zinc (Zn), magnesium (Mg) and beryllium (Be).

The p-type DBR layer 16 is configured by laminating a plurality of sets of a low refractive index layer (not shown) and a high refractive index layer (not shown). The low refractive index layer is formed, for example, of p-type $Al_{x6}Ga_{1-x6}As$ ($0<x6<1$) having a thickness of $\lambda/4n_3$ (where $\lambda$ is the oscillation wavelength, and $n_3$ is the refractive index), whereas the high refractive index layer is formed, for example, of p-type $Al_{x7}Ga_{1-x7}As$ ($0<x7<x6$) having a thickness of $\lambda/4n_4$ ($n_4$ is the refractive index).

It is to be noted here that at the portion of the low refractive index layer, spaced from the active layer 14 side by a few of the above-mentioned sets, of the p-type DBR layer 16, a current confinement layer 16C is formed in place of the low refractive index layer. Incidentally, FIG. 1 shows as an example of the case where the current confinement layer 16C is formed at the portion of the low refractive index layer spaced from the active layer 14 side by one of the sets. Of the current confinement layer 16C, a central region is a current injecting region 16C-1, and the peripheral region surrounding the current injecting region 16C-1 is a current confinement region 16C-2. The current confinement region 16C-1 is formed, for example, of Alx8Ga1-x8As (x6<x8≦1) and is, for example, circular in shape as viewed along the lamination direction. The current confinement region 16C-2 is configured to include Al2O3 (aluminum oxide) obtained by oxidizing the semiconductor laminate structure 11 from the side surface of the semiconductor laminate structure 11, and is, for example, annular in shape as viewed along the lamination direction. This ensures that the current confinement layer 16C has the function of confining the currents injected from the metal part 32 (described layer), which functions as a p-side electrode, and an n-side electrode 18.

The p-type contact layer 17 is composed, for example, of p-type GaAs, and has a light outgoing window 17A which is, for example, circular in shape in a region opposed to the current injecting region 16C-1. The n-side electrode 18 has a structure in which, for example, an alloy layer of gold (Au) and germanium (Ge), nickel (Ni) layer and a gold (Au) layer are laminated in this order from the side of the substrate 10, and it is electrically connected to the substrate 10.

<Second light Detector 2>

The semiconductor light detector 2 has a semiconductor laminate structure 21 and an n-side electrode 25. The semiconductor laminate structure 21 is formed by a method in which, for example, an n-type contact layer 22, a light absorbing layer 23, and a p-type contact layer 24 are laminated in this order on a substrate 20 (see FIG. 2), then the substrate 20 is removed to expose the n-type contact layer 22, and that region of the exposed n-type contact layer 22 which is opposed to the light emitting region 14a is removed. Incidentally, the semiconductor laminate structure 21 corresponds to the "second semiconductor laminate structure" in the present invention, and the p-type contact layer 24 corresponds to the "third semiconductor layer of the second conduction type" in the present invention.

The substrate 20 and the semiconductor laminate structure 21 are each composed, for example, of a GaAs based compound semiconductor, like the substrate 10 and the semiconductor laminate structure 11 described above. The substrate 20 is composed, for example, of n-type GaAs. The n-type contact layer 22 is composed, for example, n-type $Al_{x9}Ga_{1-x9}As$ ($0 \leqq x9 \leqq 1$), and has an opening in a region opposed to the light emitting region 14A. The light absorbing layer 23 is composed, for example, of n-type $Al_{x10}Ga_{1-x10}As$ ($0 \leqq x10 \leqq 1$), absorbs a part of the light emitted from the light emitting region, and transforms the absorbed light into an electrical signal. The electrical signal is inputted as a light output monitor signal to a light output computing circuit (not shown) connected to the metal part 32, to be used in the light output computing circuit for measuring the output level of a laser beam going out through the light outgoing window 17A. The p-type contact layer 24 is composed, for example, of p-type $Al_{x11}Ga_{1-x11}As$ ($0 \leqq x11 \leqq 1$), and is electrically connected to the light absorbing layer 23. The n-side electrode 25 is formed on the n-type contact layer 22, and, like the n-type contact layer 22, has an opening in a region opposed to the light emitting region 14A. The n-side electrode 25 is electrically connected to the n-type contact layer 22. Here, the respective openings formed in the n-type contact layer 22 and the n-side electrode 25 constitute an opening part W1.

<Layer Composed of Light Transmitting Part 31 and Metal Part 32>

The layer composed of a light transmitting part 31 and a metal part 32 is provided between the light outgoing window 17A side (p-type contact layer 17) of the plane light emission type semiconductor laser 1 and the p-type contact layer 24 of the semiconductor light detector 2. The light transmitting part 31 is provided in a region corresponding to the light emitting region 14A, and the metal part 32 is provided in a region corresponding to the outer peripheral region of the light emitting region 14A.

Here, the light transmitting part 31 is composed of an insulating material capable of transmitting the light emitted from the light emitting region 14A, for example, SiN, $SiO_2$, air, a semiconductor or the like. The transmitting part 31 transmits the light (inducedly emitted light and spontaneously emitted light), emitted to the side of the semiconductor light detector 2, of the light emitted from the light emitting region 14A. On the other hand, the metal part 32 is composed of a metal high in reflectance, for example, gold (Au) or the like. The metal part 32 reflects the light (inducedly emitted light and spontaneously emitted light), emitted to the side of the semiconductor light detector 2, of the light emitted from the light emitting region 14A to the side of the plane light emission type semiconductor laser 1, thereby inhibiting the incidence of the light on the semiconductor light detector 2. In addition, since the metal part 32 is provided between the p-type contact layer 17 and the p-type contact layer 24, it is electrically connected to both of the p-type contact layer 17 and the p-type contact layer 24. Therefore, the metal part 32 functions also as a p-side electrode for the plane light emission type semiconductor laser 1 and the semiconductor light detector 2.

Incidentally, the layer composed of the light transmitting part 31 and the metal part 32 is preferably formed by a method wherein, for example, a layer composed of a light transmitting part 31A and a metal part 32A and formed on a surface of the semiconductor laminate structure 11 and a layer composed of a light transmitting part 31B and a metal part 32B and formed on a surface of the semiconductor laminate structure 21 are laminated onto each other, at the time of stacking the plane light emission type semiconductor laser 1 and the semiconductor light detector 2 on each other, as exemplified in the description below of the manufacturing method. It is to be noted here, in this case, that the light transmitting part 31 is formed by laminating the light transmitting part 31A and the light transmitting part 31B on each other, and the metal part 32 is formed by laminating the metal part 32A and the metal part 32B on each other. Besides, the layer composed of the light transmitting part 31 and the metal part 32 may, for example, be preliminarily formed on a surface of either one of the semiconductor laminate structure 11 and the semiconductor laminate structure 21, at the time of stacking the plane light emission type semiconductor laser 1 and the semiconductor light detector 2 on each other.

The semiconductor light emitting apparatus configured as above-described can be manufactured, for example, as follows.

FIGS. 2 to 5 illustrate the manufacturing process, in the order of manufacturing steps. In order to manufacture the semiconductor light emitting apparatus, the semiconductor laminate structure 11 composed of the GaAs based compound semiconductors is formed on the substrate 10 composed of GaAs, and the semiconductor laminate structure 21 composed of the GaAs based compound semiconductors on the substrate 20 composed of GaAs, by an MOCVD (Metal Organic Chemical Vapor Deposition) method, for example. In this case, for example, trimethylaluminum (TMA), trimethylgallium (TMG) or arsine ($AsH_3$) is used as a raw material for the GaAs based compound semiconductor; hydrogen selenide ($H_2Se$), for example, is used as a raw material for the donor impurity; and dimethylzinc (DMZn), for example, is used as a raw material for the acceptor impurity.

Specifically, first, the n-type DBR layer 12, the n-type clad layer 13, the active layer 14, the p-type clad layer 15, the p-type DBR layer 16 and the p-type contact layer 17 are laminated in this order on the substrate 10, and the n-type contact layer 22, the light absorbing layer 23 and the p-type contact layer 24 are laminated in this order on the substrate 20.

Next, an insulating material such as $SiO_2$ is built up on the p-type contact layer 17 and the p-type contact layer 24, and then a photoresist (not shown) is applied to the region, corresponding to the light emitting region 14A, of the surface of the insulating material thus built up. Subsequently, with the photoresist as a mask, the insulating material is selectively removed by a wet etching method using a hydrofluoric acid based etching liquid, for example. As a result, the light transmitting parts 31A and 31B are formed. Thereafter, a layer of a metal such as gold (Au) is formed by vacuum evaporation, and then the photoresist is removed. As a result, the metal parts 32A and 32B are formed.

Figure 2:
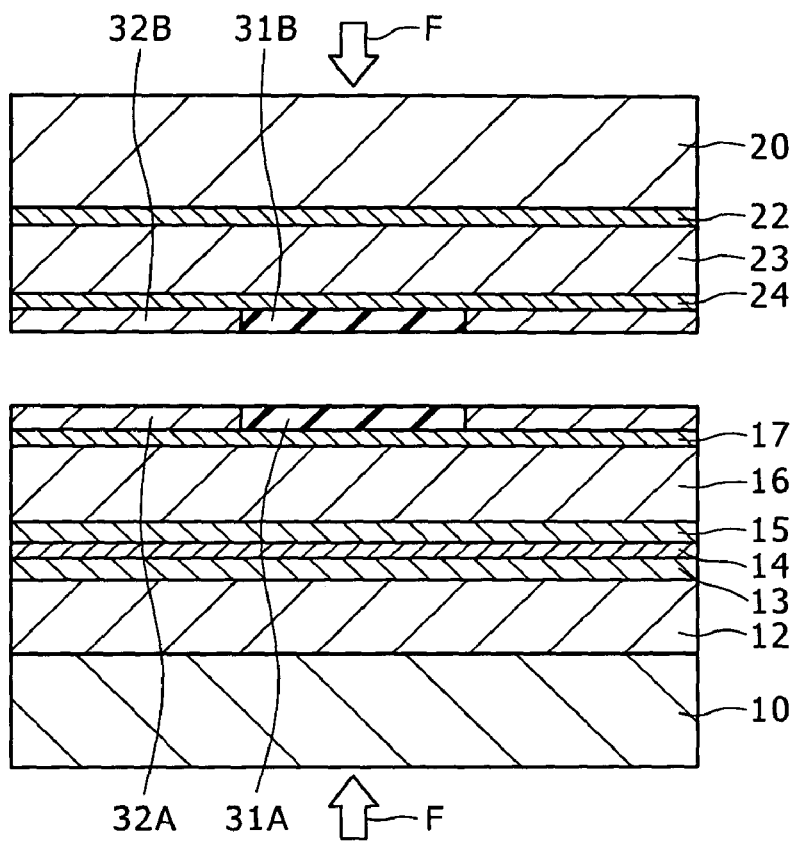
FIG. 2 is a sectional diagram for illustrating a manufacturing step of the semiconductor light emitting apparatus shown in FIG. 1.
Figure 3:
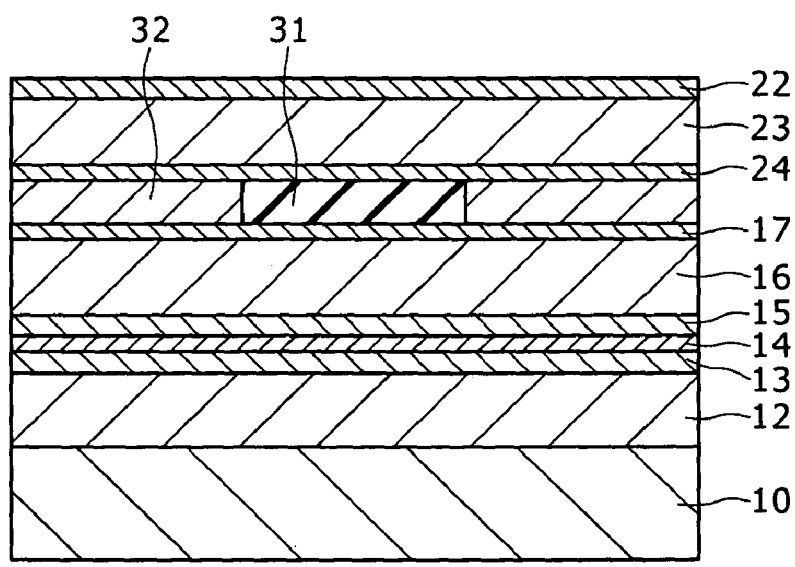
FIG. 3 is a sectional diagram illustrating a step subsequent to the step of FIG. 2.

Subsequently, the light transmitting part 31A and the light transmitting part 31B are set opposite to each other, while the metal part 32A and the metal part 32B are set opposite to each other, these parts are put into a high-temperature condition, and a pressure F is exerted thereon from the substrate 10 side and from the substrate 20 side, to laminate the light transmitting parts 31A and 31B on each other and laminate the metal parts 32A and 32B on each other (FIG. 2). Upon this, a layer composed of the light transmitting part 31 and the metal part 32 is formed, resulting in that the substrate 10, the semiconductor laminate structure 11, the layer composed of the light transmitting part 31 and the metal part 32, the semiconductor laminate structure 21, and the substrate 20 are laminated in this order and are integrally formed. Thereafter, the substrate 20 is removed by a CMP (Chemical Mechanical Planarization) method, for example (FIG. 3).

Thus, in the present embodiment, an insulating material such as $SiO_2$ is used for the layer (light transmitting part 31) for transmitting the light going toward the semiconductor light detector 2 side, and a metal is used for the layer (metal part 32) for reflecting the light going toward the semiconductor light detector 2 side so as to inhibit the incidence of the light on the semiconductor light detector 2, so that these layers can be formed by patterning. This ensures that the layers having such functions can be formed more accurately, as compared with case of forming these layers by oxidizing parts of the semiconductor laminate structure 21 constituting the semiconductor light detector 2 as in, for example, Patent Document 1. Thus, in the present embodiment, a method extremely high in controllability can be used, so that scattering of characteristics among the semiconductor light emitting devices can be made extremely slight.

Besides, in this embodiment, an insulating material such as $SiO_2$ is used for the layer (light transmitting part 31) for transmitting the light going toward the semiconductor light detector 2 side, and a metal is used for the layer (metal part 32) for reflecting the light going toward the semiconductor light detector 2 side so as to inhibit the incidence of the light on the semiconductor light detector 2, so that it is unnecessary to use a step which would cause a volumetric contraction, such as oxidation of a semiconductor layer. This eliminates the possibility of peeling caused by a volumetric contraction as in the technology described in Patent Document 1, so that the yield and the reliability are extremely high, as compared with the case of using a step which would cause a volumetric contraction, such as oxidation.

In addition, in the present embodiment, the metal part 32A and the metal part 32B are laminated on each other, so that it is possible to enhance the adhesion between the semiconductor laminate structure 11 on the substrate 10 side and the semiconductor laminate structure 21 on the substrate 20 side. This eliminates the fear of exfoliation of the laminated parts, and eliminates the possibility that the yield and/or the reliability might be lowered due to the lamination.

Figure 4:
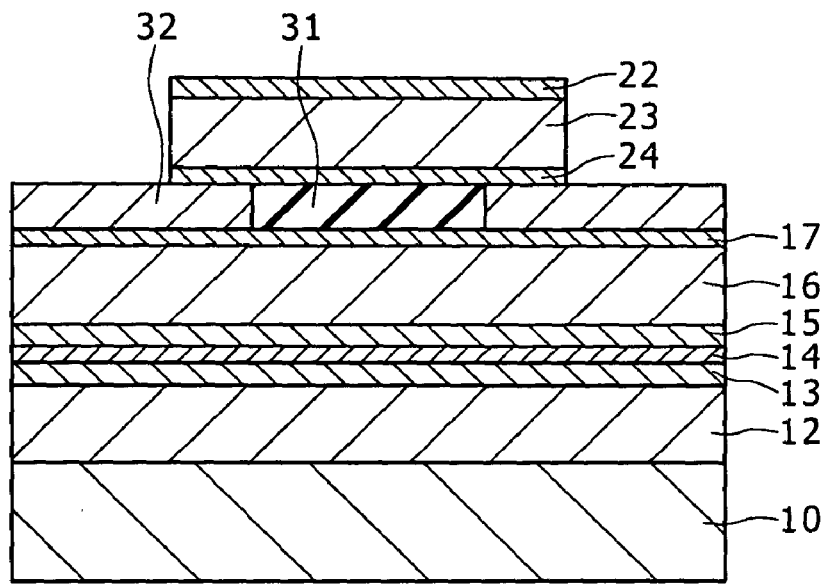
FIG. 4 is a sectional diagram illustrating a step subsequent to the step of FIG. 3.
Figure 5:
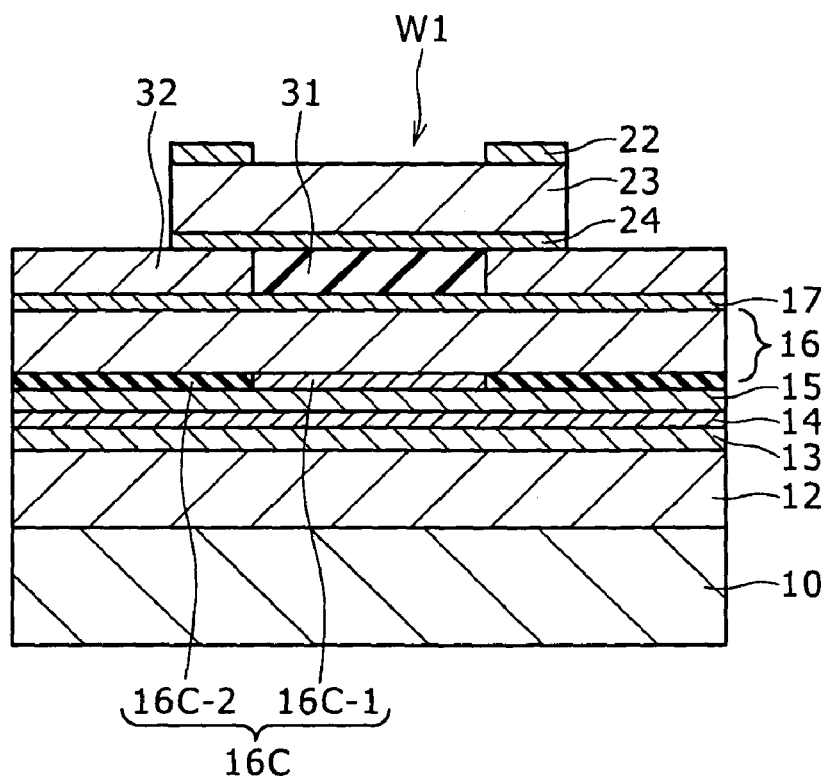
FIG. 5 is a sectional diagram illustrating a step subsequent to the step of FIG. 4.

Next, a layer of a photoresist (not shown) is formed on the n-type contact layer 22, and the photoresist is formed in the region corresponding to the region including the light emitting region 14A, based on a photolithography technique. Subsequently, with the photoresist as a mask, the n-type contact layer 22, the light absorbing layer 23, and the p-type contact layer 24 are selectively removed and the metal part 32 is exposed, by a dry etching method using a chlorine based etching gas, for example (FIG. 4). As a result, the metal part 32 functioning also as a p-side electrode is formed with a region for wire bonding. Thereafter, in the same manner as above, the region corresponding to the light emitting region 14A, of the n-type contact layer 22, is selectively removed so as to form an opening (FIG. 5). Thereafter, the photoresist is removed.

Subsequently, an oxidizing treatment at a high temperature is conducted in a water vapor atmosphere, so as to selectively oxidize the Al contained in a high concentration in a portion of the low refractive index layer spaced from the active layer 14 side by one of the above-mentioned sets. As a result, the region (peripheral region) other than a central region, of the portion, is turned into an insulating layer (aluminum oxide). Upon this, the current confinement region 16C-2 is formed in the peripheral region, so that the central region becomes the current injecting region 16C-1 (FIG. 5).

In the next place, a layer of a photoresist (not shown) is formed over the entire surface, and the photoresist is formed in the regions other than the n-type contact layer 22, based on a photolithography technique. Subsequently, AuGe, Ni and Au are layered in this order by use of a vapor deposition method, for example. Thereafter, the photoresist is removed. As a result, the n-side electrode 25 is formed, and the opening part W1 is formed (FIG. 1). Thereafter, in the same manner as above, layers of AuGe, Ni and Au are formed in this order on the back side of the substrate 10, to form the n-side electrode 18 (FIG. 1). In this manner, the semiconductor light emitting apparatus according to the present embodiment is manufactured.

In this semiconductor light emitting apparatus, when a voltage of a predetermined potential difference is impressed between the metal part 32 and the n-side electrode 18, a current confined by the current confinement layer 16C is injected into the light emitting region 14A, i.e., a gain region of the active layer 14, whereby light emission by re-coupling of electrons and positive holes is generated. The light thus emitted includes not only the light generated by induced emission but also the light generated by spontaneous emission. However, since the induced emission is repeated in the semiconductor laminate structure 11 by the emitted light, laser oscillation is generated at a predetermined wavelength, and a beam of light L1 with the predetermined wavelength is let go out through the light outgoing window 17A.

In this instance, since the light transmitting part 31 and the semiconductor light detector 2 are arranged in this order at the light outgoing window 17A of the plane light emission type semiconductor laser 1, the light L1 going out through the light outgoing window 17A is transmitted through the light transmitting part 31, before being incident on the light absorbing layer 23 of the semiconductor light detector 2. A part of the light L1 incident on the light absorbing layer 23 is absorbed by the light absorbing layer 23, and is converted into an electrical signal (photo-current) according to the output level of the light thus absorbed. As a result, the electrical signal has a magnitude according to the output level of the light going out through the light outgoing window 17A. The electrical signal is outputted to a light output computing circuit (not shown) through a wire connected to the metal part 32. The current signal coming from the metal part 32 is received by the light output computing circuit as a light output monitor signal, whereby the output level of the laser beam going out through the light outgoing window 17A is measured.

Figure 6:
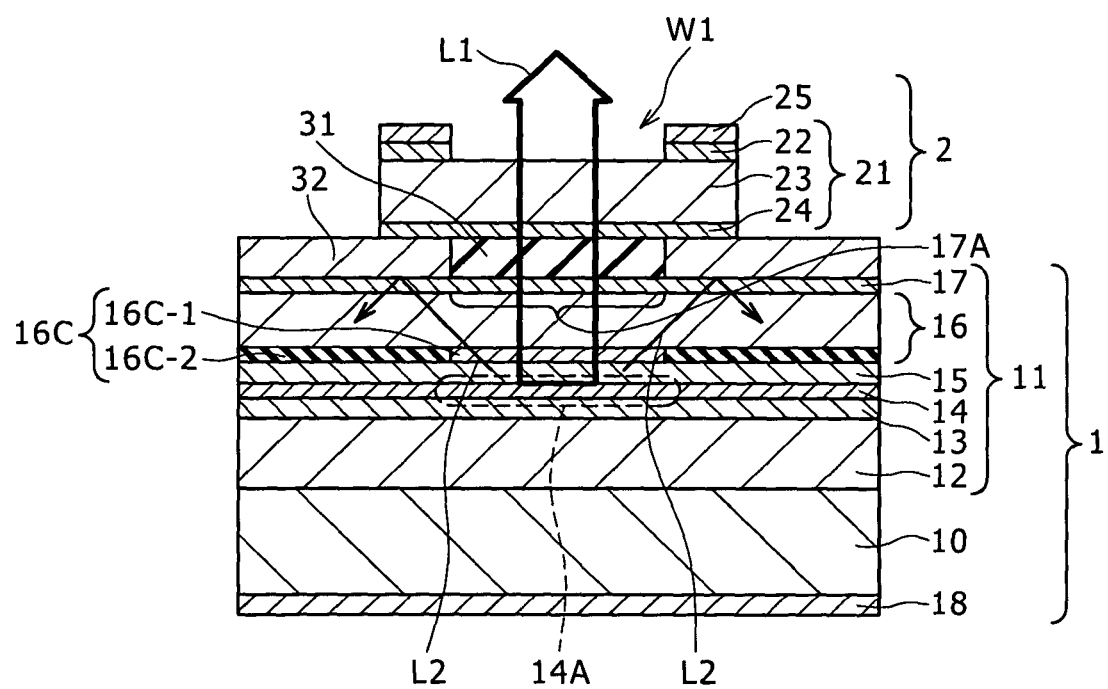
FIG. 6 is a sectional diagram for illustrating the operation of the semiconductor light emitting apparatus shown in FIG. 1.

Here, most of the inducedly emitted light (light L1), emitted toward the semiconductor light detector 2 side, of the light emitted from the light emitting region 14A is transmitted through the light transmitting part 31, to be incident on the semiconductor light detector 2. On the other hand, most of the spontaneously emitted light (light L2), emitted to the semiconductor light detector 2 side, of the light from the light emitting region 14A is reflected by the metal part 32 toward the plane light emission type semiconductor laser 1 side, whereby incidence thereof on the semiconductor light detector 2 is inhibited (FIG. 6). This is because the inducedly emitted light has such a directivity as to be scarcely emitted to the metal part 32 side, whereas the spontaneously emitted light has no directivity and is mostly emitted to the metal part 32 side. This ensures that the quantity of the spontaneously emitted light transmitted through the light transmitting part 31 is made extremely small, as compared with the quantity of the inducedly emitted light transmitted through the light transmitting part 31. In addition, since the metal part 32 generally has an extremely high reflectance, the quantity of the spontaneously emitted light transmitted through the metal part 32 is almost negligible, as compared with the quantity of the spontaneously emitted light transmitted through the light transmitting part 31.

Thus, in the semiconductor light emitting apparatus according to this embodiment, the layer composed of the light transmitting part 31 and the metal part 32 is provided between the plane light emission type semiconductor laser 1 and the semiconductor light detector 2, so that the spontaneously emitted light emitted to the side of the layer composed of the light transmitting part 31 and the metal part 32 is substantially inhibited from being incident on the semiconductor light detector 2. As a result, the level of detection of the spontaneously emitted light by the semiconductor light detector 2 can be lowered, so that light detection accuracy can be enhanced.

Besides, in the present embodiment, the layer composed of the light transmitting part 31 and the metal part 32 and the semiconductor light detector 2 are provided on the plane light emission type semiconductor laser 1, so that the area of contact between the p-type contact layer 17 and the metal part 32 is necessarily enlarged, so that the series resistance can be lowered.

Second Embodiment

Figure 7:
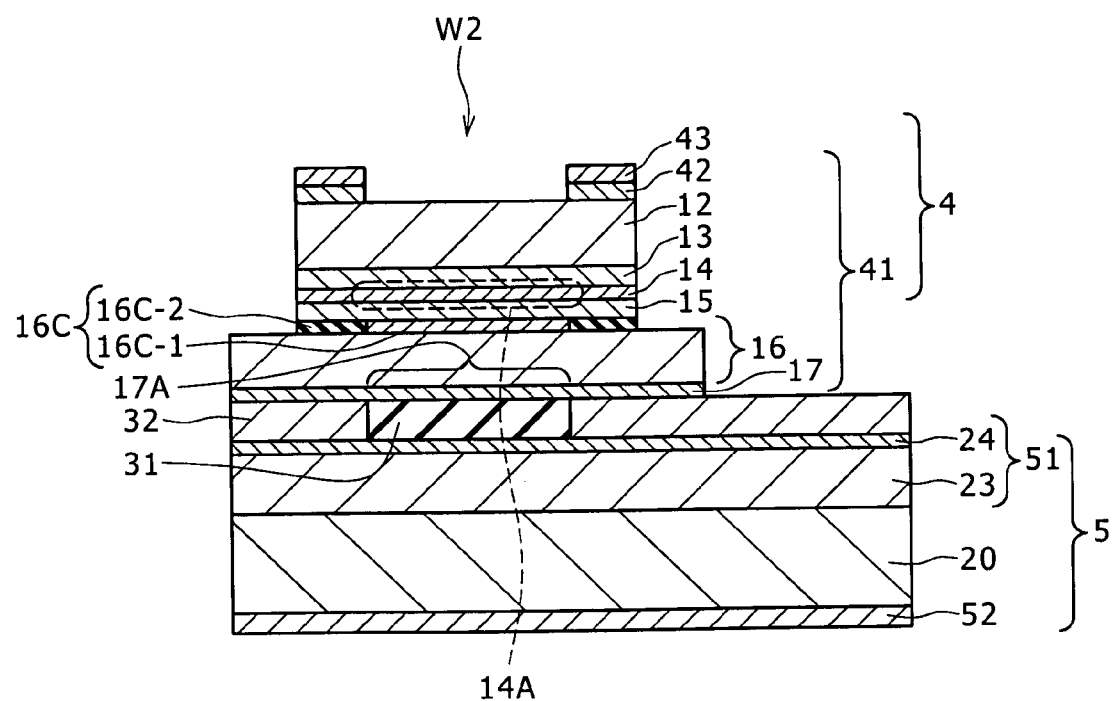
FIG. 7 is a sectional diagram showing the configuration of a semiconductor light emitting apparatus according to a second embodiment of the present invention.

FIG. 7 illustrates the structure of a semiconductor light emitting apparatus according to a second embodiment of the present invention. Incidentally, FIG. 7 schematically shows the structure, and dimensions and shapes in the figure are different from the actual ones. Besides, in the following description, the same symbols as in the above-described embodiment denote the elements having the same or equivalent configurations and functions to those of the above-mentioned elements denoted by the same symbols.

The semiconductor light emitting apparatus has a configuration in which a layer composed of a light transmitting part 31 and a metal part 32, and a plane light emission type semiconductor laser 4 are arranged in this order on a semiconductor light detector 5, and the plane light emission type semiconductor laser 4, the semiconductor light detector 5, and the layer composed of the light transmitting part 31 and the metal part 32 are integrally formed. In this semiconductor light emitting apparatus, the light emitted from the plane light emission type semiconductor laser 4 is let go out through an opening part W2 (described later) to the exterior, and is let slightly go out through a light outgoing window 17A and the layer composed of the light transmitting part 31 and the metal part 32 toward the semiconductor light detector 5. Further, an electrical signal according to the output level of the light going out to the semiconductor light detector 5 is outputted from the semiconductor light detector 5.

Specifically, this semiconductor light emitting apparatus has a configuration in which the layer composed of the light transmitting part 31 and the metal part 32, and the semiconductor light detector 5 are arranged in this order on the side opposite to the side where the light emitted from the plane light emission type semiconductor laser 4 principally goes out to the exterior; in this point, this embodiment is different from the above-described embodiment in which the layer composed of the light transmitting part 31 and the metal part 32, and the semiconductor light detector 2 are arranged in this order on the side where the light emitted from the plane light emission type semiconductor laser 1 principally goes out to the exterior. In view of this, the different points will be mainly described in detail below, and descriptions of the same or equivalent configurations, operations and effects to those in the above embodiment will be omitted appropriately.

<Plane Light Emission Type Semiconductor Laser 4>

The plane light emission type semiconductor laser 4 has a semiconductor laminate structure 41 and an n-side electrode 43. The semiconductor laminate structure 41 is formed, for example, by a method in which an n-type contact layer 42, an n-type DBR layer 12, an n-type clad layer 13, an active layer 14, a p-type clad layer 15, a p-type DBR layer 16, and a p-type contact layer 17 are laminated in this order on a substrate 10, then the substrate 10 is removed to expose the n-type contact layer 42, and a region opposed to a light emitting region 14A, of the n-type contact layer 42 thus exposed, is removed. Incidentally, the semiconductor laminate structure 41 corresponds to the "first semiconductor laminate structure" in the present invention, the n-type contact layer 42, the n-type DBR layer 12 and the n-type clad layer 13 correspond to the "first semiconductor layer of a first conduction type" in the present invention, and the p-type clad layer 15, the p-type DBR layer 16 and the p-type contact layer 17 correspond to the "second semiconductor layer of a second conduction type" in the present invention.

The n-type contact layer 42 is composed, for example, of n-type GaAs, and has an opening which is, for example, circular shape in a region opposed to the above-mentioned current injecting region 16C-1. The n-side electrode 43 has a configuration in which, for example, an alloy-layer composed of gold (Au) and germanium (Ge), a nickel (Ni) layer and a gold (Au) layer are laminated in this order on the n-type contact layer 42. In addition, like the n-type contact layer 42, the n-side electrode 43 has an opening which is, for example, circular in shape in a region opposed to the above-mentioned current injecting region 16C-1. The n-side electrode 43 is electrically connected to the n-type contact layer 42. Here, the openings in the n-type contact layer 42 and the n-side electrode 43 constitute an opening part W2.

<Semiconductor Light Detector 5>

The semiconductor light detector 5 has a semiconductor laminate structure 51 and an n-side electrode 52. The semiconductor laminate structure 51 is formed by crystal growth of a light absorbing layer 23 and a p-type contact layer 24 in this order on the substrate 20. Incidentally, the semiconductor laminate structure 51 corresponds to the "second semiconductor laminate structure" in the present invention, and the p-type contact layer 24 corresponds to the "third semiconductor layer of the second conduction type."

<Layer Composed of Light Transmitting Part 31 and Metal Part 32>

The layer composed of the light transmitting part 31 and the metal part 32 is provided between the light outgoing window 17A side (p-type contact layer 17) of the plane light emission type semiconductor laser 4 and the p-type contact layer 24 of the semiconductor light detector 5. The light transmitting part 31 is provided in a region corresponding to the light emitting region 14A, whereas the metal part 32 is provided in a region corresponding to an outer peripheral region of the light emitting region 14A.

Incidentally, like in the above-described embodiment, the layer composed of the light transmitting part 31 and the metal part 32 is preferably formed by a method in which, for example, a layer composed of a light transmitting part 31A and a metal part 32A and formed on a surface of the semiconductor laminate structure 41 and a layer composed of a light transmitting part 31B and a metal part 32B and formed on a surface of the semiconductor laminate structure 51 are laminated on each other, at the time of stacking the plane light emission type semiconductor laser 4 and the semiconductor light detector 5 on each other. In addition, the layer composed of the light transmitting part 31 and the metal part 32 may be preliminarily formed on the surface of either one of the semiconductor laminate structure 41 and the semiconductor laminate structure 51, at the time of stacking the plane light emission type semiconductor laser 4 and the semiconductor light detector 5 on each other.

The semiconductor light emitting apparatus configured as above can be manufactured, for example, as follows.

FIGS. 8 to 11 illustrate the manufacturing process in the order of manufacturing steps. In order to manufacture the semiconductor light emitting apparatus, the semiconductor laminate structure 41 composed of GaAs based compound semiconductors is formed on the substrate 10 composed of GaAs, and the semiconductor laminate structure 51 composed of GaAs based compound semiconductors is formed on the substrate 20 composed of GaAs, by an MOCVD method, for example.

Specifically, first, the n-type contact layer 42, the n-type DBR layer 12, the n-type clad layer 13, the active layer 14, the p-type clad layer 15, the p-type DBR layer 16, and the p-type contact layer 17 are laminated in this order on the substrate 10, and the light absorbing layer 23 and the p-type contact layer 24 are laminated in this order on the substrate 20.

Figure 8:
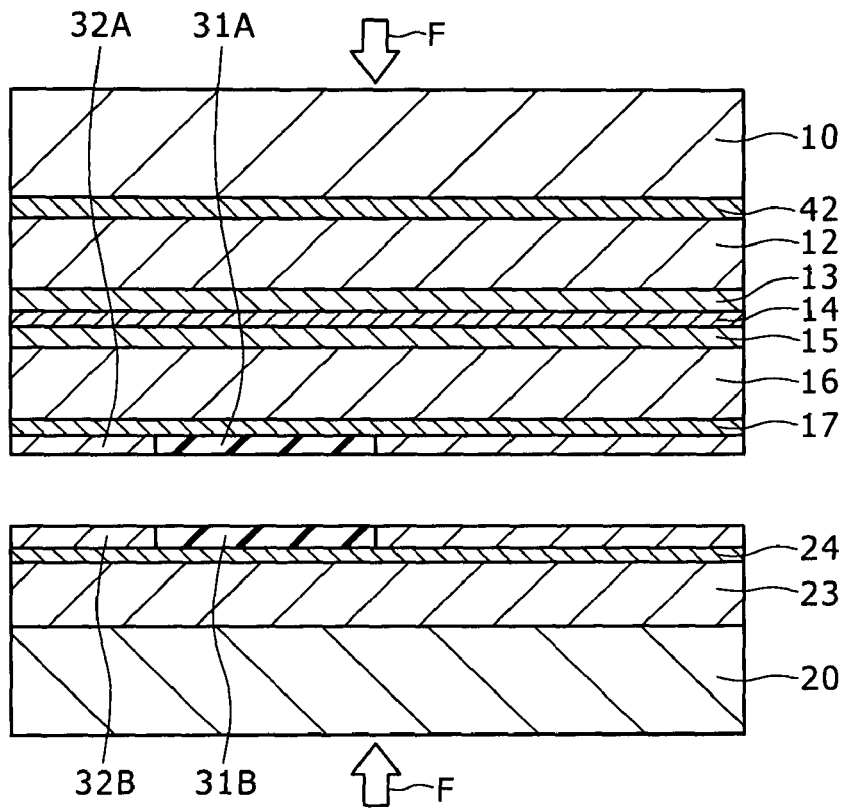
FIG. 8 is a sectional diagram for illustrating a manufacturing step of the semiconductor light emitting apparatus shown in FIG. 7.
Figure 9:
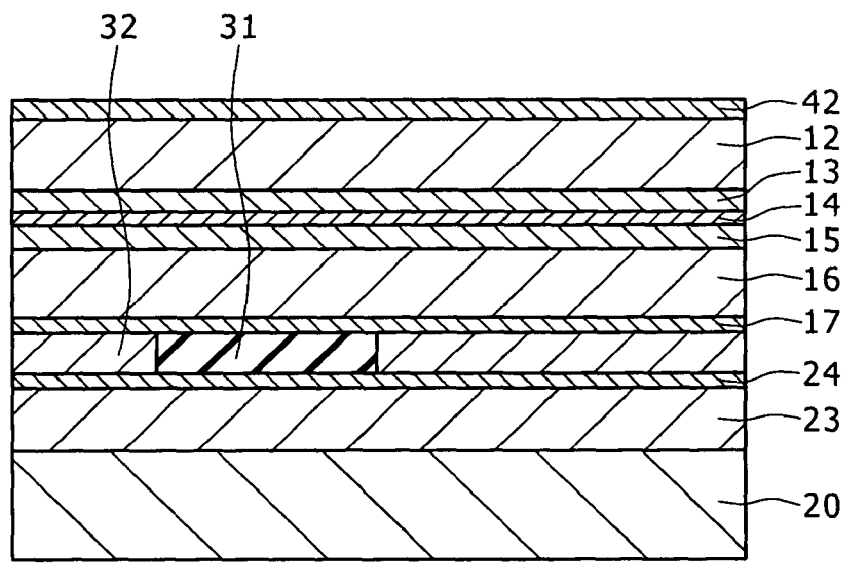
FIG. 9 is a sectional diagram illustrating a step subsequent to the step of FIG. 8.

Next, like in the above-described embodiment, the light transmitting parts 31A and 31B and the metal parts 32A and 32B are formed, then the light transmitting part 31A and the light transmitting part 31B are set opposite to each other, while the metal part 32A and the metal part 32B are set opposite to each other, these parts are put into a high-temperature condition, and a pressure F is exerted thereto from the substrate 10 side and from the substrate 20 side, whereby the light transmitting parts 31A and 31B are laminated on each other, and the metal parts 32A and 32B are laminated on each other (FIG. 8). Upon this, the layer composed of the light transmitting part 31 and the metal part 32 is formed, resulting in that the substrate 10, the semiconductor laminate structure 41, the layer composed of the light transmitting part 31 and the metal part 32, the semiconductor laminate structure 51, and the substrate 20 are integrally formed in the state of being laminated in this order. Thereafter, the substrate 10 is removed by a CMP method, for example (FIG. 9).

Thus, in the present embodiment, an insulating material such as $SiO_2$ is used for the layer (light transmitting part 31) for transmitting the light going toward the semiconductor light detector 5 side, and a metal is used for the layer (metal part 32) for reflecting the light going toward the semiconductor light detector 5 side so as to inhibit the incidence of the light on the semiconductor light detector 5; therefore, these layers can be formed by patterning. This ensures that the layers having such functions can be formed more accurately, as compared with the case of forming these layers by oxidizing parts of the semiconductor laminate structure 51 constituting the semiconductor light detector 5 as in the technology described in Patent Document 1, for example. Thus, in the present embodiment, a method which is extremely high in controllability can be used, so that scattering of characteristics among the semiconductor light emitting devices can be made extremely slight.

In addition, in the present embodiment, an insulating material such as $SiO_2$ is used for the layer (light transmitting part 31) for transmitting the light going toward the semiconductor light detector 5 side, and a metal is used for the layer (metal part 32) for reflecting the light going toward the semiconductor light detector 5 side so as to inhibit the incidence of the light on the semiconductor light detector 5; therefore, it is unnecessary to use a step which would cause a volumetric contraction, such as oxidation of the semiconductor layer(s). As a result, there is no fear of exfoliation caused by a volumetric contraction as in the technology described in Patent Document 1, and the yield and the reliability are extremely high, as compared with the case of using a step which would cause a volumetric contraction, such as oxidation.

Besides, in the present embodiment, the metal part 32A and the metal part 32B are laminated on each other, so that it is possible to enhance the adhesion between the semiconductor laminate structure 41 on the substrate 10 side and the semiconductor laminate structure 51 on the substrate 20 side. This eliminates the fear of exfoliation of the adhered portions, so that there is no possibility that the yield and/or the reliability might be lowered due to the lamination.

Figure 10:
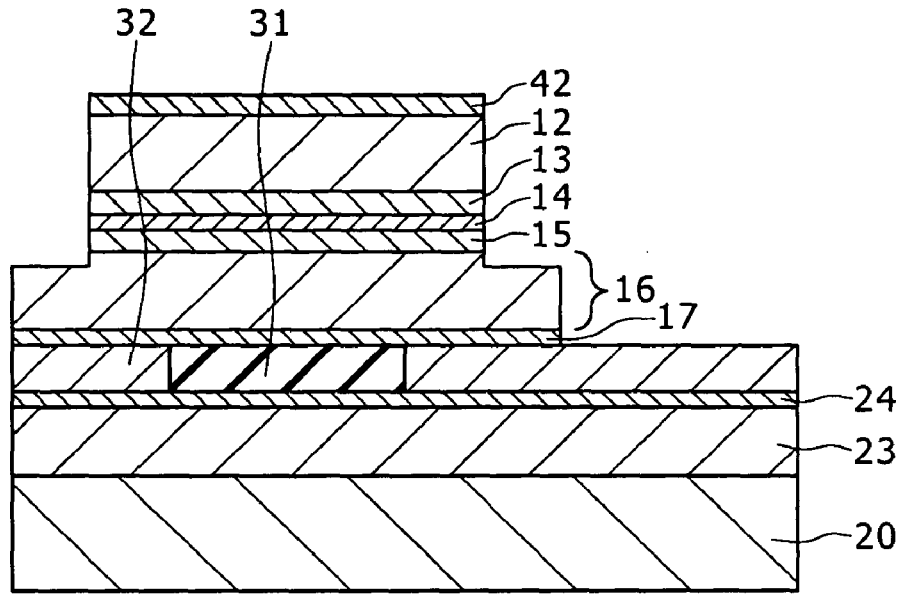
FIG. 10 is a sectional diagram illustrating a step subsequent to the step of FIG. 9.

Subsequently, a layer of a photoresist (not shown) is formed on the n-type contact layer 42, and the photoresist is formed in a region corresponding to a region including the light emitting region 14A, based on a photolithography technique. Subsequently, with the photoresist as a mask, the n-type contact layer 42, the n-type DBR layer 12, the n-type clad layer 13, the active layer 14, the p-type clad layer 15, the p-type DBR layer 16, and the p-type contact layer 17 are selectively removed and the metal part 32 is exposed, by a dry etching method using a chlorine based etching gas, for example (FIG. 10). As a result, the metal part 32 functioning as a p-side electrode is formed with a region for wire bonding. Subsequently, the photoresist is removed, then a layer of a photoresist (not shown) is newly formed on the n-type contact layer 42, and the photoresist smaller in area than the above-mentioned photoresist is formed in the region corresponding to the region including the light emitting region 14A, based on a photolithography technique. Then, with this photoresist as a mask, parts of the n-type contact layer 42, the n-type DBR layer 12, the n-type clad layer 13, the active layer 14, the p-type clad layer 15, and the p-type DBR layer 16 are selectively removed, by a dry etching method using a chlorine based etching gas, for example (FIG. 10). Thereafter, the photoresist is removed.

Figure 11:
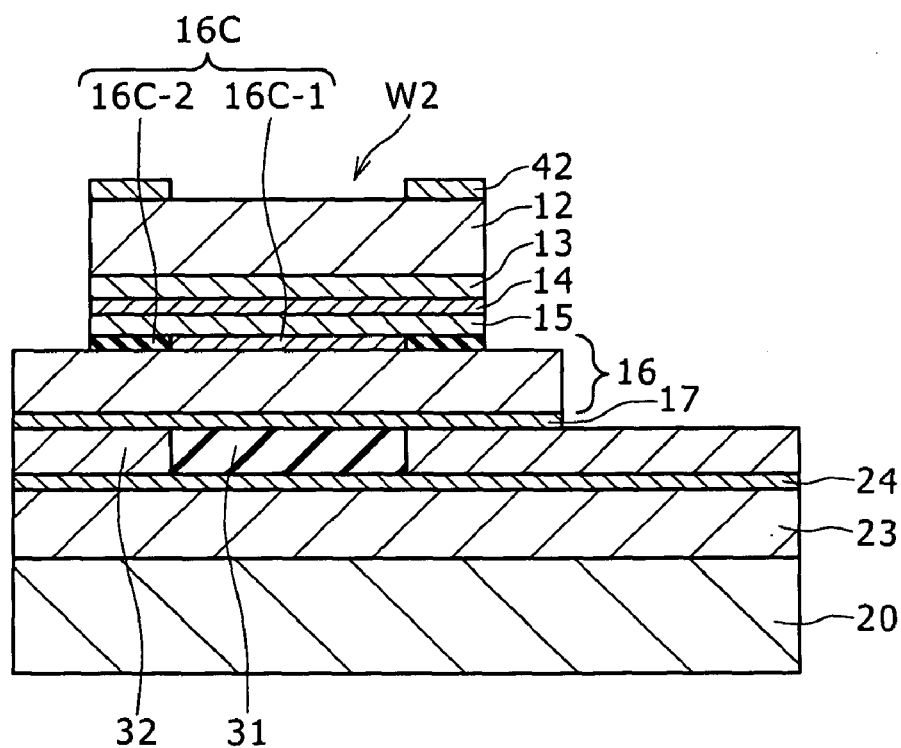
FIG. 11 is a sectional diagram illustrating a step subsequent to the step of FIG. 10.

Next, in the same manner as above, a region corresponding to the light emitting region 14A, of the n-type contact layer 42, is selectively removed to form an opening (FIG. 11). Thereafter, the photoresist is removed. Subsequently, an oxidizing treatment at a high temperature is conducted in a water vapor atmosphere, so as to selectively oxidize the Al contained in a high concentration in a portion of the low refractive index layer spaced from the active layer 14 side by one of the above-mentioned sets. Upon this, the region (peripheral region) other than the central region, of the portion, is converted into an insulating layer (aluminum oxide). As a result, the current confinement region 16C-2 is formed in the peripheral region, and the current injecting region 16C-1 is formed in the central region (FIG. 11).

In the next place, a layer of a photoresist (not shown) is formed over the entire surface, and the photoresist is formed in the regions other than the n-type contact layer 42, based on a photolithography technique. Subsequently, AuGe, Ni and Au are layered in this order by use of a vapor deposition method, for example. Thereafter, the photoresist is removed. As a result, the n-side electrode 43 is formed, and an opening part W2 is formed (FIG. 7). Thereafter, in the same manner as above, AuGe, Ni and Au are layered in this order on the back side of the substrate 20, to form the n-side electrode 52 (FIG. 7). In this manner, the semiconductor light emitting apparatus according to the present embodiment is manufactured.

In this semiconductor light emitting apparatus, when a voltage of a predetermined potential difference is impressed between the metal part 32 and the n-side electrode 43, a current confined by the current confinement layer 16C is injected into the light emitting region 14A, i.e., a gain region of the active layer 14, whereby light emission by re-coupling of electrons and positive holes is generated. The emitted light includes not only the light generated by induced emission but also the light generated by spontaneous emission. However, the induced emission is repeated in the semiconductor laminate structure 41 by the emitted light, and, as a result, laser oscillation is generated at a predetermined wavelength, and a beam of light L3 with the predetermined wavelength is let go out through the opening part W2.

In this instance, since the light outgoing window 17A of the plane light emission type semiconductor laser 4 is provided on the semiconductor detector 5 side like in the above-described embodiment but is provided on the side opposite to the opening part W2 side, the light L4 emitted to the light outgoing window 17A side, of the emitted light, is transmitted through the light transmitting part 31, before being incident on the light absorbing layer 23 of the semiconductor light detector 5. A part of the light L4 incident on the light absorbing layer 23 is absorbed by the light absorbing layer 23, and is converted into an electrical signal (photo-current) according to the output level of the light thus absorbed. This ensures that the electrical signal has a magnitude according to the output level of the light going out through the light outgoing window 17A and the output level of the light going out through the opening part W2. This current signal is outputted to a light output computing circuit (not shown) through a wire connected to the metal part 32. The current signal coming from the metal part 32 is received by the light output computing circuit as a light output monitor signal, whereby the output level of the laser beam going out through the opening part W2 is measured.

Figure 12:
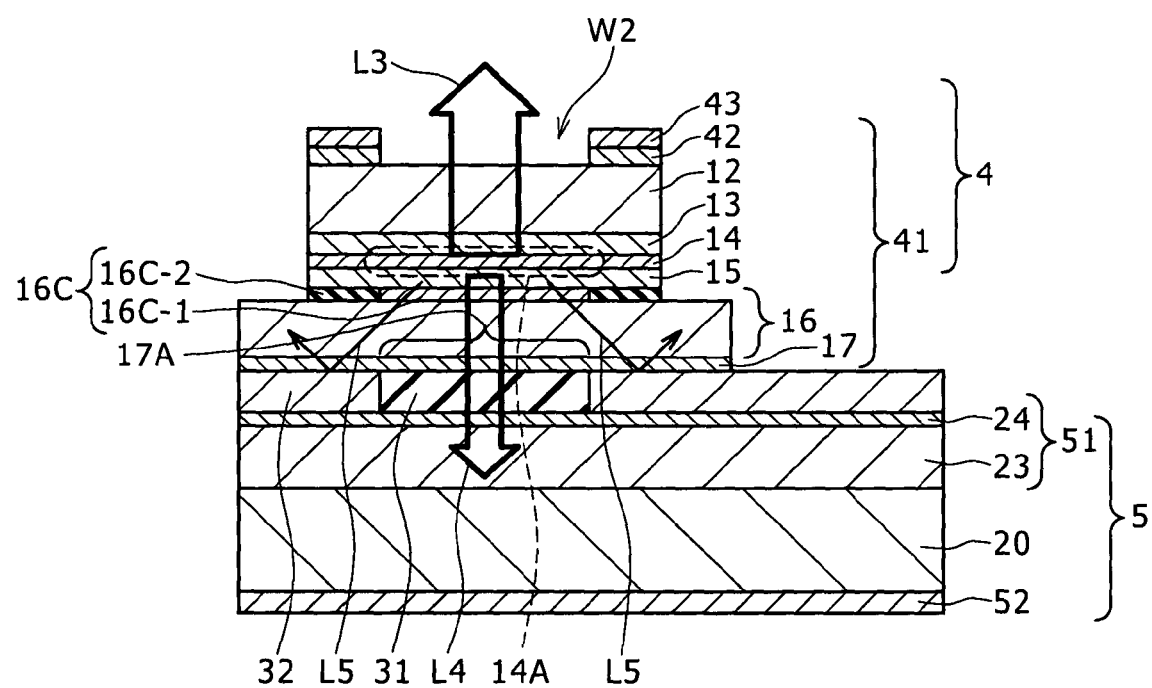
FIG. 12 is a sectional diagram for illustrating the operation of the semiconductor light emitting apparatus shown in FIG. 7.

Here, most of the inducedly emitted light (light L4) emitted to the semiconductor light detector 5 side, of the emitted light generated in the light emitting region 14A, is transmitted through the light transmitting part 31, to be incident on the semiconductor light detector 5. On the other hand, most of the spontaneously emitted light (light L5) emitted to the semiconductor light detector 5 side, of the emitted light, is reflected by the metal part 32 toward the plane light emission type semiconductor laser 4 side, and is inhibited from being incident on the semiconductor light detector 5 (FIG. 12). This is because the inducedly emitted light has such a directivity as to be scarcely emitted to the metal part 32 side, whereas the spontaneously emitted light has no directivity and is mostly emitted to the metal part 32 side. This ensures that the quantity of the spontaneously emitted light transmitted through the light transmitting part 31 can be made extremely small, as compared with the quantity of the inducedly emitted light transmitted through the light transmitting part 31. In addition, since the metal part 32 generally has an extremely high reflectance, the quantity of the spontaneously emitted light transmitted through the metal part 32 is almost negligible, as compared with the quantity of the spontaneously emitted light transmitted through the light transmitting part 31.

Thus, in the semiconductor light emitting apparatus according to the present embodiment, the layer composed of the light transmitting part 31 and the metal part 32 is provided between the plane light emission type semiconductor laser 4 and the semiconductor light detector 5, the spontaneously emitted light emitted to the side of the layer composed of the light transmitting part 31 and the metal part 32 is substantially inhibited from being incident on the semiconductor light detector 5. As a result, the level of detection of the spontaneously emitted light by the semiconductor light detector 5 can be lowered, so that light detection accuracy can be enhanced more than in the related art.

In addition, in the semiconductor light emitting apparatus, the layer composed of the light transmitting part 31 and the metal part 32 and the plane light emission type semiconductor laser 4 are arranged on the semiconductor light detector 5, so that the diameter of the plane light emission type semiconductor laser 4 can be set smaller than that in the above-described embodiment, and, where the diameter is set smaller, the parasitic capacity arising from the current confinement layer 16C can be lowered.

While the present invention has been described based on the embodiments above, the invention is not limited to the above embodiments, and various modifications are possible.

For example, while the case where a GaAs based compound semiconductor is used as a semiconductor material has been described in the above embodiments, the semiconductors may be composed of a GaInP based (red system) material, an AlGaAs based (infrared system) semiconductor, a GaN based (bluish green system) material or the like.

Besides, while the layer composed of the light transmitting part 31 and the metal part 32 is put in contact with the p-type semiconductor layer (p-type contact layers 17, 24) in the above embodiments, the layer may be put in contact with the n-type semiconductor layer.

Further, the present invention is not limited to the manufacturing method described in detail in the embodiments above, the invention may be applied to other manufacturing methods.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor light emitting apparatus comprising:
a first semiconductor laminate structure including a semiconductor light emitter having a light emitting region and a current confinement layer and comprised of an inner semiconductor material region having a maximum width or diameter surrounded by an insulating material;
a second semiconductor laminate structure including a semiconductor light detector having a light absorbing layer for absorbing a part of the light output from said first semiconductor laminate structure and generating an electrical signal relative to an amount of light output; and
an intermediate layer provided between the first and second semiconductor laminate structures, the intermediate layer comprising a metal reflecting part for preventing a portion of light emitted from said semiconductor light emitter from reaching said semiconductor light detector, the metal reflecting part including an opening defining a light transmitting part;
wherein said first semiconductor laminate structure, said intermediate layer, and said second semiconductor laminate structure are integrally formed in a vertically stacked direction; and
wherein at least a portion of the metal reflecting part is formed directly above or directly below at least a portion of each of the first and second semiconductor laminate structures and further wherein contact layers which are closest to the intermediate layer for the semiconductor light emitter and semiconductor light detector are formed in a layer that is separate from the intermediate layer, and further wherein said light transmitting part of said intermediate layer is comprised of an insulating material capable of transmitting the light emitted from said light emitting region and selected from the group consisting of SiN and $SiO_2$.

2. The semiconductor light emitting apparatus as set forth in claim 1, wherein:
said second semiconductor laminate structure includes an opening part through which light is finally emitted from the semiconductor light emitting apparatus; and
said light outgoing window of said first semiconductor laminate structure and said semiconductor light detector of said second laminate structure are provided on a same side of the light emitting region as the opening part.

3. The semiconductor light emitting apparatus as set forth in claim 1, wherein:
said first semiconductor laminate structure includes an opening part through which light is finally emitted from the semiconductor light emitting apparatus; and
said opening part of said first semiconductor laminate structure and said semiconductor light detector of said second laminate structure are provided on a side of the light emitting region opposite the side on which the opening part is formed.

4. The semiconductor light emitting apparatus as set forth in claim 1,
wherein said metal part of said intermediate layer functions as an electrode for at least one of said semiconductor light emitter and said semiconductor light detector.

5. The semiconductor light emitting apparatus as set forth in claim 1, and further
wherein said metal reflecting part is comprised of gold.

6. The semiconductor light emitting apparatus as set forth in claim 1,
wherein said first semiconductor laminate structure is configured by laminating a first semiconductor layer of a first conduction type, an active layer including said light emitting region, and a second semiconductor layer of a second conduction type connected to said metal part, in this order; and
said second semiconductor laminate structure includes said light absorbing layer, and a third semiconductor layer of the second conduction type physically connected to said metal reflecting part.

7. The semiconductor light emitting apparatus as set forth in claim 1, wherein said light transmitting part and said metal reflective part comprising said intermediate layer are formed in a same profile and are substantially co-extensive in the vertical direction.

8. The semiconductor light emitting apparatus as set forth in claim 1, wherein said intermediate layer constitutes a single continuous layer and wherein the lateral ends of the light transmitting part are entirely surrounded by said metal reflective part and immediately adjacent the metal reflective part.

9. The semiconductor light emitting apparatus as set forth in claim 1, wherein said semiconductor light emitting apparatus further comprises a substrate, and said semiconductor light detector is positioned between said light emitting region and said substrate and detects light emitted from said light emitting region in a direction towards the substrate.

10. The semiconductor light emitting apparatus as set forth in claim 1, wherein said semiconductor light emitting apparatus further comprises a substrate, and said semiconductor light detector detects light emitted from said light emitting region in a direction away from the substrate.

11. The semiconductor light emitting apparatus as set forth in claim 1, wherein the inner diameter of the light reflecting metal part of the intermediate layer defining the diameter of the light transmitting part is substantially equal to the diameter of the light outgoing window formed in the first semiconductor laminate structure.

12. The semiconductor light emitting apparatus as set forth in claim 1, wherein said intermediate layer is substantially co-extensive with one of either said first semiconductor laminate structure or said second semiconductor laminate structure, and is not co-extensive with the other of said first semiconductor laminate structure or said second semiconductor laminate structure.

13. The semiconductor light emitting apparatus as set forth in claim 1, wherein the width of said first semiconductor laminate structure is narrower than the width of said second semiconductor laminate structure.

14. The semiconductor light emitting apparatus as set forth in claim 1, wherein said semiconductor light emitter is a diode emitter.

15. The semiconductor light emitting apparatus as set forth in claim 1, wherein horizontal planes defined by each of said first semiconductor laminate structure, said intermediate layer, and said second semiconductor laminate structure are separate and distinct from one another.

16. The semiconductor light emitting apparatus as set forth in claim 1, wherein the light transmitting part of said intermediate layer is immediately adjacent the semiconductor light detector.

17. The semiconductor light emitting apparatus as set forth in claim 4, wherein said metal part of said intermediate layer functions as an electrode for both said semiconductor light emitter and said semiconductor light detector.

18. The semiconductor light emitting apparatus as set forth in claim 1, wherein the width of said second semiconductor laminate structure is narrower than the width of said first semiconductor laminate structure.

19. The semiconductor light emitting apparatus as set forth in claim 1, wherein said light transmitting part of the intermediate layer has substantially the same cross-sectional size and shape as the inner semiconductor material region of the current confinement layer.

20. The semiconductor light emitting apparatus as set forth in claim 1, wherein said inner semiconductor material region of the current confinement layer is comprised of a III-V semiconductor containing aluminum, and the insulating material surrounding the inner semiconductor material comprises aluminum oxide.

* * * * *